(12) United States Patent
Kuttner

(10) Patent No.: US 7,173,557 B2
(45) Date of Patent: Feb. 6, 2007

(54) ANALOG/DIGITAL CONVERTER

(75) Inventor: Franz Kuttner, Ulrich (AT)

(73) Assignee: Infineon Technologies AG, Munich ( * ) Notice: Subject to any disclaimer, the term of this patent is extended or adjusted under 35 U.S.C. 154(b) by 1055 days.

(21) Appl. No.: 10/216,651

(22) Filed: Aug. 9, 2002

(65) Prior Publication Data

US 2003/0052809 A1  Mar. 20, 2003

(30) Foreign Application Priority Data

Aug. 10, 2001  (DE) ................. 101 39 488

(51) Int. Cl.
*H03M 1/34* (2006.01)
(52) U.S. Cl. ................. 341/163; 341/110; 341/141; 341/126; 370/532; 370/537
(58) Field of Classification Search ................. 370/532, 370/535, 537, 545; 341/110, 108, 126, 132, 341/141, 162, 163
See application file for complete search history.

(56) References Cited

U.S. PATENT DOCUMENTS

| | | | | |
|---|---|---|---|---|
| 4,069,479 A * | 1/1978 | Carpenter et al. | .......... | 341/139 |
| 5,057,841 A | 10/1991 | Veerhoek et al. | .......... | 341/156 |
| 5,252,976 A * | 10/1993 | Miho et al. | .......... | 341/163 |
| 5,870,052 A * | 2/1999 | Dedic et al. | .......... | 341/161 |
| 5,926,123 A * | 7/1999 | Ostrom et al. | .......... | 341/120 |
| 6,181,268 B1 * | 1/2001 | Miyake et al. | .......... | 341/161 |
| 6,351,231 B1 * | 2/2002 | Price et al. | .......... | 341/155 |

* cited by examiner

*Primary Examiner*—Ricky Q. Ngo
*Assistant Examiner*—Nguyen H. Ngo
(74) *Attorney, Agent, or Firm*—Fish & Richardson P.C.

(57) ABSTRACT

An A/D converter for converting an analog input into a binary-encoded word includes a bit-weight memory storing bit weights that include maximum, mimimum, and medium weights. During a conversion step, first and second registers store lower and upper weights, and a D/A converter converts one of the upper and lower weights into an analog bit-weighting signal. A comparison device provides a comparison result indicative of a comparison between the analog input and the analog bit-weighting signal and stores the result in a third register. A multiplexer selects the upper weight when the analog input exceeds the analog bit-weighting signal and the lower weight otherwise. A subtractor subtracts, from the bit weight of a preceding conversion step, a smaller weight that is smaller than, but closest, to the previous bit weight. An adder adds the new lower weight to the smaller weight to get a new upper bit weight.

24 Claims, 6 Drawing Sheets

ANALOG/DIGITAL CONVERTER

RELATED APPLICATIONS

This application claims the benefit of the Aug. 10, 2001 priority date of German application 101 39 488.8, the contents of which are herein incorporated by reference.

FIELD OF INVENTION

The present invention relates to A/D converters.

BACKGROUND

Successive approximation is a conversion method which is used for medium-speed analog/digital converters (A/D) [U. Tietze—Ch. Schenk, Halbleiterschaltungs-technik [Semiconductor Circuit Engineering], 10th edition, p. 780 ff].

FIG. 5 shows the basic construction of a known analog/digital converter 500 with a weighing method and with successive approximation. The analog/digital converter 500 has a sample & hold element 502 for sampling and storing an analog input signal $U_E$, and a comparator 504 for comparing the stored input signal $U_E$ with the analog output signal U(Z) from a digital/analog converter 506. The sample & hold element 502 is needed to store an input signal $U_E$ temporarily in order that changes in the input signal $U_E$ during the conversion period do not cause any errors.

At the beginning of a conversion, the number Z at the input of a digital/analog converter (506) is set to zero. The most significant bit (MSB) is then set to one and a check is made to see whether the analog input signal $U_E$ of the analog/digital converter 500 is greater than U(Z). If this is so, the bit remains set. Otherwise, it is reset again. The most significant bit is therefore "weighed". This weighing operation is then repeated for each further bit until, at the conclusion, the least significant bit (LSB) has also been fixed. In this way, in a register 508, which is also referred to as a register for a successive approximation (SAR; SAR=Successive Approximation Register), a number is produced which, after conversion by the digital/analog converter 506, results in a voltage U(Z) which agrees with the analog input signal $U_E$ within a resolution for the least significant bit $U_{LSB}$. The register 508 typically comprises flip-flops, which are connected up to form a shift register.

The maximum conversion speed of the analog/digital converter 500 of FIG. 5 is determined by the fact that the n-bit digital/analog converter 506 has to make n decisions, each of these decisions having to be as accurate as the final conversion result itself. The digital/analog converter 506 has to supply n comparison values U(Z) for each conversion of an input signal $U_E$, time of course being used until these n comparison values U(Z) are generated by the digital/analog converter 506 with the desired accuracy. The digital/analog converter 506 swings approximately exponentially to the desired value $u=U_0(1-e^{-t/\tau})$. In addition, the comparator 504 needs time to compare the comparison values with the analog input signal $U_E$ to be converted. This time depends on the step height of the analog input signal $U_E$. The time needed by the digital/analog converter 506 to swing to a ½ LSB is given by $$t = \tau \times \ln\left(\frac{1}{2} \times \frac{1}{2^n}\right)$$

In order to increase the conversion speed of an analog/digital converter, a larger error can be permitted during each conversion step, which leads to the converters already known which have redundant code.

An analog/digital converter with redundant code is produced from a binary analog/digital converter when the elements, such as resistors, with which the reference value, for example a reference voltage, is divided in order to supply comparison values, are not weighted in a binary manner but are weighted with a smaller numeric base than 2. There are therefore a plurality of codes relating to one and the same analog value, and as a result small wrong decisions have no influence on the conversion result. In the case of a conventional binary converter without redundancy, for example the MSB, if it is wrongly set by an error, can no longer be corrected in the subsequent conversion steps. In the case of an analog/digital converter with redundant code, if the error is not too great, there is a second code which corresponds to the same analog input signal.

In the case of an analog/digital converter with redundant code, the digital/analog converter is constructed, for example, not by using a reference element, a reference element of twice the size, a reference element of four times the size; instead multiplication is carried out with a value smaller than 2. In this case, the reference elements can have, for example, the weighting 1; 1.8; 1.8×1.8; 1.8×1.8×1.8, etc. Here, reference elements can be, for example, capacitors, current sources, resistors, etc.

The analog/digital conversion is then carried out in such a way that, firstly, the analog value to be converted or the analog input signal is stored. The analog value is then compared with somewhat more than half the reference value, by the largest reference element and, in addition, one or more smaller reference elements being set in the digital/analog converter. If, for example, the numeric base 1.8556 is used, the attempt can be carried out by using 1000100 . . . If the analog value to be measured is greater than the comparison value, the leading 1 remains set, and the next comparison is carried out by using 1100010 . . . If the analog value is smaller, then the MSB is set to zero, and the next comparison is carried out by using 0100010 . . . In the case of this algorithm, a redundant code is produced in which there are a plurality of codes relating to one and the same analog value. An error which occurs in the MSB can as a result be compensated for in the subsequent conversion steps.

FIG. 6 shows a known analog/digital converter with redundant code. The analog/digital converter 600 has an arrangement 602 of reference capacitors 604 with fixed weighting 1 p; 1.8556 p; 3.4432 p; 6.3892 p and 11.8559 p, which forms a digital/analog converter. A reference voltage $U_{REF}$ can be applied to this arrangement 602 of reference capacitors 604 as desired via switches 606 either to sample an analog input voltage $U_E$ or to produce a comparison voltage to be compared with the analog input voltage. The analog/digital converter 600 also has a comparator 608, at which the input voltage $U_E$ and the comparison voltage produced from the reference voltage $U_{REF}$ can be compared at inputs 610 and 612. The comparator 608 can be bypassed by switches 614 and 616, in order to sample and to store the input voltage $U_E$ at the start of a conversion. During a comparison by the comparator 608, the result of the comparison is passed on to a register 618 with successive approximation (SAR) which, on the basis of the result of the instantaneous comparison, drives and selects the reference capacitors 604 of the arrangement 602 for the next comparison in such a way that a gradual approximation (successive approximation) to the actual input voltage $U_E$ is achieved. The comparison and gradual approximation is carried out down to the least significant bit (LSB). Once the result of the conversion has been achieved, then the register 618 passes on the value determined, which is encoded with the redundant code, to an adder 620. The adder 620 calls up the reference capacitance values of the arrangement 602 from a memory 622 and, by means of addition with an adder 620, corrects the value determined in the redundant code in order to produce a binary value. An accumulator register AKK REG 624 stores the binary encoded value as the result of the analog/digital conversion and outputs it.

One disadvantage of the analog/digital converter 600 of FIG. 6, which has reference elements that are not binary-weighted but weighted with a smaller numeric base than 2, is that such reference elements, which have a base value of 1.8556, for example, as shown in FIG. 6, cannot readily be produced by doubling etc. of the basic reference element. This is because, in the layout of a circuit for an analog/digital converter, odd reference values are more difficult to implement than simple doublings, as in the case of binary weighting. The result is therefore in principle greater errors than in the case of a binary analog/digital converter.

A further disadvantage of the analog/digital converter 600 of FIG. 6 is that the redundant code has to be converted into a binary code in the adder 620 for further use. Rounding errors occur in the process.

A further disadvantage of the analog/digital converter 600 of FIG. 6 is that, in the case of a redundant code, smaller reference capacitors often have to be disconnected and larger reference capacitors have to be connected in order to produce a comparison value, that is to say many switching operations occur, which make it necessary to recharge capacitors and therefore lead to an increased power consumption of the analog/digital converter.

SUMMARY

The object of the present invention is to provide an analog/digital converter which operates quickly, accurately and energy-efficiently.

One advantage of the analog/digital converter according to the invention is that any desired bit weights or reference values can be used for the comparison between an analog input value and a comparison value, depending on the requirement for speed and accuracy.

A further advantage of the analog/digital converter according to the present invention is that, during the production of comparison values, for example reference capacitors only have to be connected and not disconnected, which permits energy-efficient operation of the analog/digital converter.

A further advantage of the analog/digital converter according to the present invention is that the same readily permits both a cold start and a warm start in which the conversion values from a preceding conversion are used in order to reduce the conversion time.

According to a preferred development, the analog/digital converter also has a device for initializing the lower bit weighting value in the first device for temporary storage and the upper bit weighting value in the second device for temporary storage.

According to a further preferred development, the analog/digital converter also has a device for reading a binary encoded bit weight from the device for the storage and for the supply of the binary encoded bit weight read out to the device for the subtraction and the device for the addition.

According to a further preferred development, the initialization device initializes the lower and the upper bit weighting value at the start of the first conversion step to the central binary encoded bit weight of the group of binary encoded bit weights, and the reading device reads the maximum binary encoded bit weight during the first conversion step.

According to a further preferred development, the initialization device initializes the lower and the upper bit weighting value at the start of the first conversion step to the binary encoded data word from a preceding conversion and, during the first conversion step, the reading device reads a binary encoded bit weight which is associated with an upper and lower bit weighting value and which is located in the vicinity of the binary encoded data word from the preceding conversion.

According to a further preferred development, the digital/analog converter comprises (a) a capacitor cell matrix which comprises capacitor cells arranged in columns and rows in the form of a matrix, and which are driven via control lines by means of thermometer-encoded control signals;

(b) a first encoding device for recoding the n most significant data bits of the bit weighting value to be converted into a $2^n$-bit wide thermometer-encoded column control signal, which is applied via column control lines to the capacitor cell matrix;

(c) a second encoding device for recoding the m least significant data bits of the bit weighting value to be converted into a $2^m$-bit wide thermometer-encoded row control signal, which is applied via row control lines to the capacitor cell matrix;

(d) each capacitor cell of the capacitor cell matrix respectively having an associated local decoder circuit which, as a function of the thermometer-encoded row control signal and the thermometer-encoded column control signal, drives switches which switch through at least one capacitor contained in the capacitor cell to different reference voltages ($V_p$, $V_n$).

According to a further preferred development, the local decoder circuit of the capacitor cell arranged in the ith column and the jth row of the digital/analog converter has a first logic circuit for the logical NAND combination of the signal applied to the ith column control line and the signal applied to the jth row control line, a second logic circuit for the logical inversion of the signal applied to the i–1th column control line, and a third logic circuit for the logical NAND combination of the output signals of the first logic circuit and of the second logic circuit to form a local control signal for the switches of the capacitor cell.

According to a further preferred development, the capacitor cells of the capacitor cell matrix of the digital/analog converter are constructed differentially.

According to a further preferred development, the capacitor cell of the digital/analog converter has two capacitors with the same capacitance, which can each be connected via two associated switches to a positive reference voltage ($V_P$) or a negative reference voltage ($V_n$).

According to a further preferred development, the local decoder circuit of the digital/analog converter is constructed differentially.

According to a further preferred development, the local decoder circuit of the digital/analog converter has a first decoder device, which drives the switches of the first capacitor of the differentially constructed capacitor cell as a function of the applied thermometer-encoded control signals, and has a second decoder device, which drives the switches of the second capacitor of the differentially constructed capacitor cell as a function of the applied inverted thermometer-encoded control signals.

According to a further preferred development, the capacitors of the capacitor cells of the digital/analog converter each have a first connection, which is connected to two controllable switches for switching to a positive and a negative reference voltage, and a second connection, which is connected to a common potential node of the capacitor cell matrix.

According to a further preferred development, the common potential node of the capacitor cell matrix of the digital/analog converter is connected to a signal output of the digital/analog converter for the output of the analog output signal.

According to a further preferred development, the local decoder circuit of the digital/analog converter is supplied with a supply voltage ($V_{DD}$) via a level-changing circuit in order to increase the voltage range on the capacitors.

According to a further preferred development, the control lines of the digital/analog converter are constructed differentially.

According to a further preferred development, the digital/analog converter also has a buffer to read the reference voltages ($V_p$, $V_n$) or the analog input signal into the capacitor cell matrix and is arranged in order to sample the analog input signal, and is also connected to the comparison device, in order to supply the analog input signal and the analog bit weighting signal to the comparison device.

According to a further preferred development, the conversion steps are controlled by a clock signal.

According to a further preferred development, the lower bit weighting value and the upper bit weighting value are calculated one clock cycle before the selection in the selection device.

According to a further preferred development, the group of binary encoded bit weights in the case of a 10-bit conversion has bit weights of 512, 256, 128, 64, 32, 16, 8, 4, 2, 1 with 10 conversion steps, or 478, 255, 136, 72, 38, 20, 11, 6, 4, 2, 1 with 11 conversion steps, or 447, 251, 142, 80, 45, 25, 14, 8, 5, 3, 2, 1 with 12 conversion steps.

According to a further preferred development, the storage device has a read-only memory (ROM), a direct access memory (RAM), an electrically erasable programmable read-only memory (EPROM) or a decoder.

According to a further preferred development, the first, second and third temporary storage device in each case has a register which is controlled by the clock signal.

According to a further preferred development, the selection device has a digital multiplexer.

According to a further preferred development, the comparison device has a comparator.

According to a further preferred development, the analog/digital converter also has a buffer store for the temporary storage and for the output of the binary encoded data word.

Preferred exemplary embodiments of the present invention are explained in more detail below with reference to the appended drawings, in which:

DETAILED DESCRIPTION

The comparison with somewhat more than half the reference value, described above for the start of a conversion in relation to an analog/digital conversion with redundant code, can of course also be carried out with a binary-weighted digital/analog converter by the first comparison being carried out not with half the reference value but with somewhat more. In the case of a 10-bit converter, for example, the first comparison is not carried out with 512 (half the reference value) but with 577. If the analog value to be converted is greater than 577, it may be assumed that the analog value is certainly greater than 447. During the next conversion step, depending on the result of the first comparison, a comparison is made with 316 or 763 (447+316). The values for the next conversion step, here 316 and 763, can be selected on the basis of how large the error is to be at each conversion step.

Figure 5:
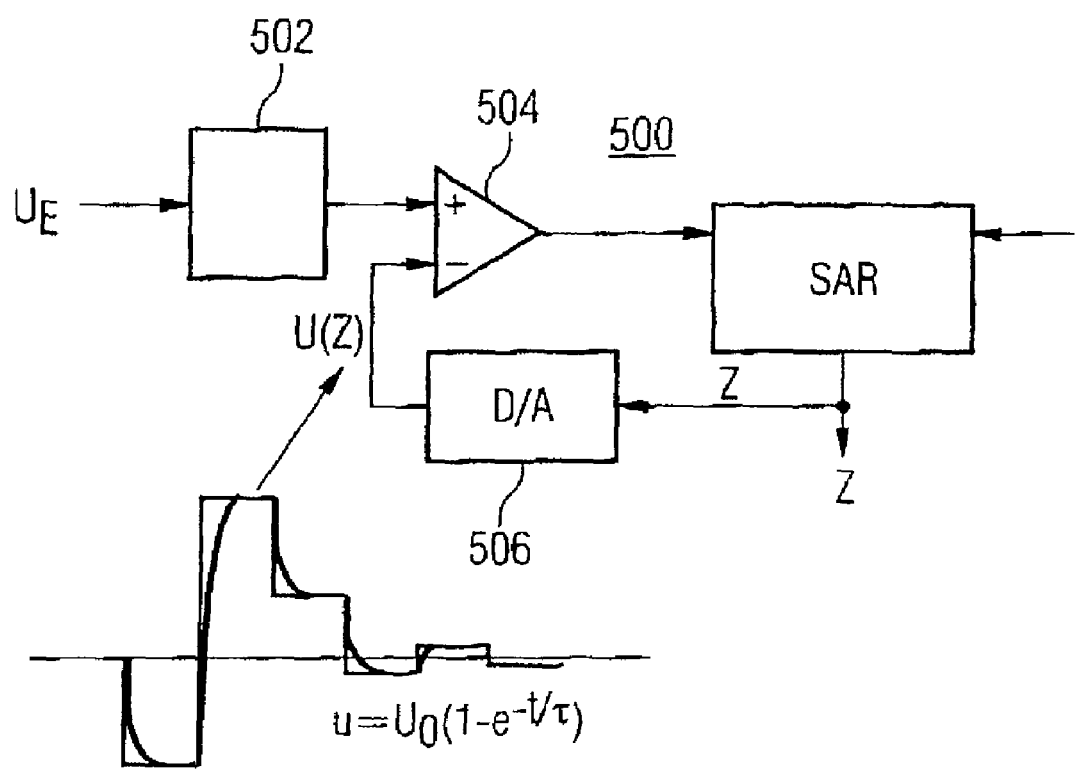
FIG. 5 shows the basic construction of a known analog/digital converter with the weighing methods and with successive approximation.
Figure 6:
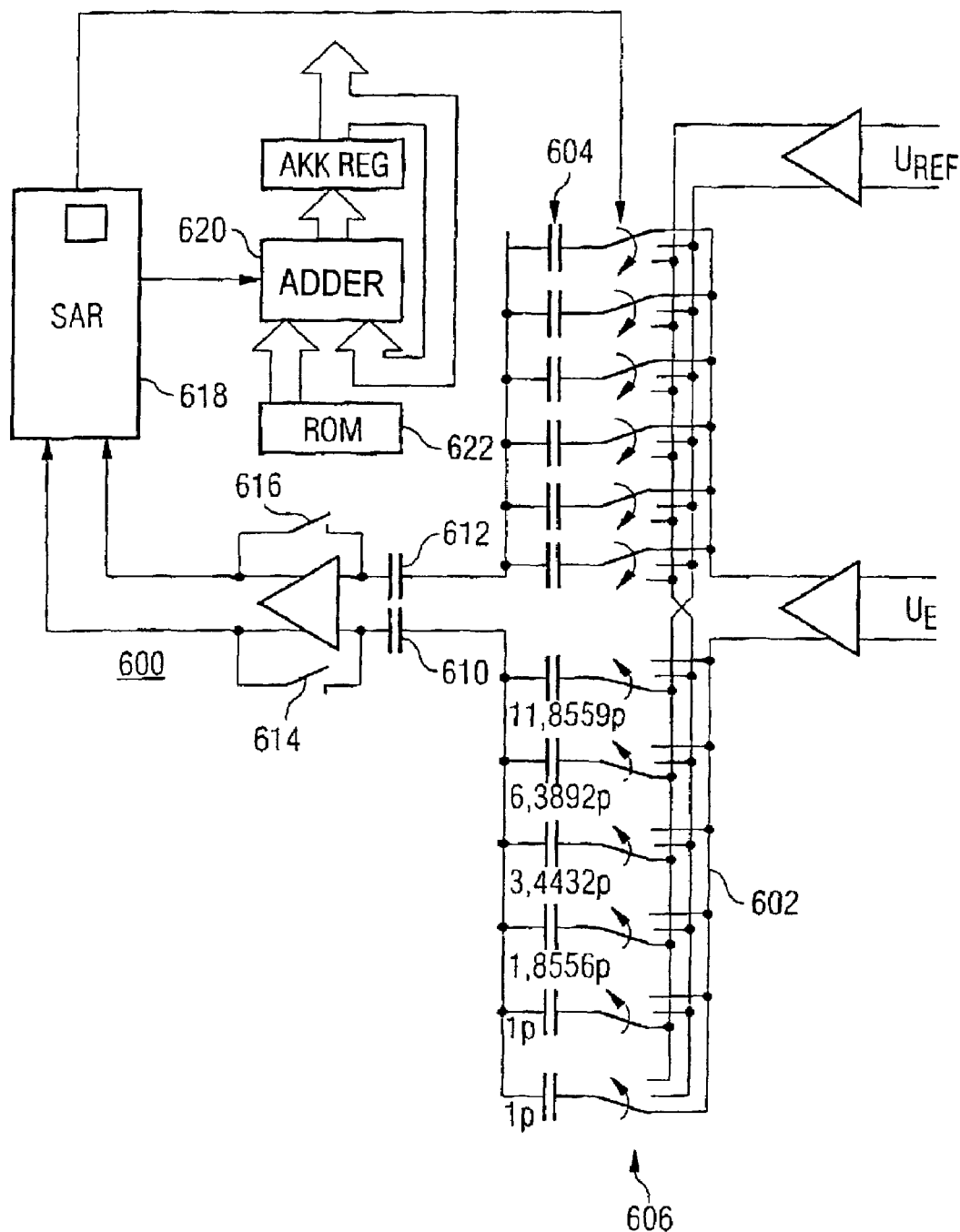
FIG. 6 shows a known analog/digital converter with redundant code.

Since the conversion sequence becomes more complex, the digital function can no longer be implemented by a register with successive approximation, as shown in FIG. 5 or 6. In the case of a conventional analog/digital converter with successive approximation, the digital control is implemented, as is known, by a shift register which has 10000 . . . as the starting value. The 1 is shifted onward during each conversion step, and the result of the comparison is written into the place at which the 1 has remained. In the case of a redundant converter, 10001000 . . . , for example, is used as the starting value, both ones being shifted onward during each step.

Figure 1:
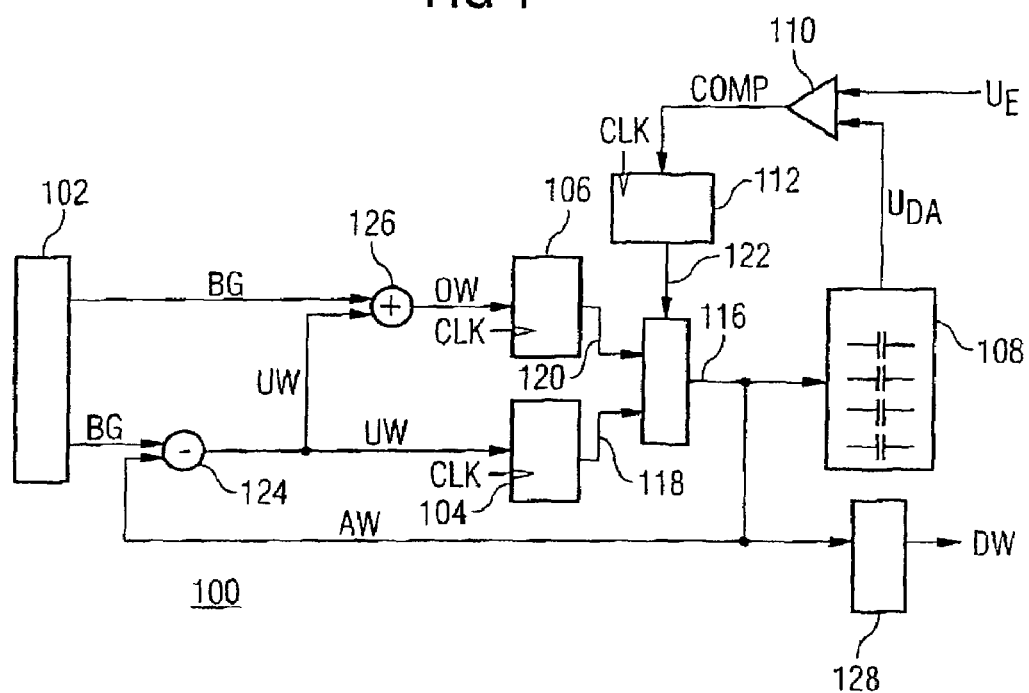
FIG. 1 shows an analog/digital converter according to the present invention.

FIG. 1 shows an analog/digital converter according to the invention for converting an analog input signal $U_E$ into a binary encoded data word DW during a number of conversion steps. The analog/digital converter 100 has a memory 102 for storing binary encoded bit weights. The memory 102 preferably has a read-only memory (ROM), a direct access memory (RAM), an electrically erasable programmable read-only memory (EPROM; EPROM=Erasable Programmable ROM) or a decoder.

Stored in the memory 102 are at least a minimum, a medium and a maximum binary encoded bit weight. In the case of a 10-bit conversion, a group of bit weights 512, 256, 128, 64, 32, 16, 8, 4, 2 and 1 is preferably stored in the memory 102. This group of 10 bit weights corresponds to a normal binary converter and comprises 10 conversion steps or, in the case of control by a clock frequency, 10 clock cycles, which are needed for the 10-bit conversion. It is also possible to use a group of 11 bit weights 478, 255, 136, 72, 38, 20, 11, 6, 4, 2, 1, which corresponds to a 10-bit conversion with 11 conversion steps, or a group of 12 bit weights 447, 251, 142, 80, 45, 25, 14, 8, 5, 3, 2 and 1, which corresponds to a 10-bit conversion with 12 conversion steps. The bit weights are selected in the groups in such a way that, in the case of the first-named group, an error of ±0% is permitted during each conversion step, in the case of the second-named group, an error of ±7% is permitted during each conversion step and, in the case of the last-named group, an error of ±14.5% is permitted during each conversion step. The groups of bit weights can be stored on their own or together in the memory 102, in order to permit flexible operation of the analog/digital converter 100. The invention therefore constitutes a digital solution with arbitrary selection of the codes. The memory 102 is preferably driven by a sequence control system, and the bit weights therein are selected, the sequence control system knowing the starting point in a group of binary encoded bit weights. It is always only one group of binary encoded bit weights or one sequence of bit weights which is selected, and a plurality of bit weight sequences is never run through in parallel or mixed form.

The analog/digital converter 100 also has a first register 104 for storing a value, which is controlled by a clock signal CLK and outputs its stored value at a rising clock edge, or else another type of time-controlled temporary store. A lower bit weighting value UW is stored temporarily in the first register 104 during a conversion step of the analog/digital converter 100 or a clock cycle of the signal CLK. The analog/digital converter 100 also has a second register 106, which is controlled by the clock signal CLK and outputs its stored value at a rising clock edge, or else another time-controlled temporary store, in which an upper bit weighting value OW is stored temporarily during a conversion step or clock cycle of the clock signal CLK. The lower bit weighting value UW and the upper bit weighting value OW are calculated from the bit weights which are stored in the memory 102.

The analog/digital converter 100 also has a digital/analog converter 108, which optionally converts either the lower bit weighting value UW of the first register 104 or the upper bit weighting value OW of the second register 106 into an analog bit weighting signal $U_{DA}$ during a conversion step. The digital/analog converter 108 is preferably a digital/analog converter with a capacitor network and thermometer-encoded drive, which is described further below in the description and in the German Patent Application No. 100 52 944.5, "Digital/Analog-Wandler" [Digital/Analog Converter] of the Applicant, which is included herein in its entirety by reference.

The analog/digital converter 100 also has a comparator 110 for the respective comparison of the analog input signal $U_E$ with the analog bit weighting signal $U_{DA}$ and to supply a comparison result COMP during a conversion step or clock cycle. The comparator 110 is followed by a further, third register 110 for the respective temporary storage of the comparison result COMP from the comparator 110 during a conversion step. The third register 112 can have any other device for the temporary storage of a value and is likewise time-controlled via the clock signal CLK, preferably with a rising flank of the clock signal.

The analog/digital converter 100 also has a multiplexer 114 or another device for the selection of a signal from a plurality of signals. The multiplexer 114 is firstly arranged in such a way as to select the upper bit weighting value OW, which is temporarily stored in the second register 106, in each case during a conversion step and to output it at an output 116 of the multiplexer 114 when the comparison result COMP, which is temporarily stored in the third register 112, indicates that the analog input signal $U_E$ of the analog/digital converter 100 is greater than the analog bit weighting signal $U_{DA}$ of the digital/analog converter 108. Secondly, the multiplexer 114 is arranged in such a way as to select the lower bit weighting value UW, which is temporarily stored in the first register 104, in each case during a conversion step and to output it at the output 116 of the multiplexer 114 when the comparison result COMP, which is temporarily stored in the third register 112, indicates that the analog input signal $U_E$ is smaller than the analog bit weighting signal $U_{DA}$.

Therefore, during a conversion step, the multiplexer 114 in each case supplies at its output 116 a bit weighting value AW selected from the upper bit weighting value OW and the lower bit weighting value UW. For this purpose, the multiplexer 114 is preferably connected, via connections 118 and 120, to the first register 104 and the second register 106 and, via a connection 122, to the third register 112.

The analog/digital converter 100 also has a subtractor 124 and an adder 126. During a conversion step, the subtractor 124 in each case subtracts a binary encoded bit weight BG from the bit weighting value AW selected by the multiplexer 114, in order to produce a new lower bit weighting value UW. The subtracted binary encoded bit weight BG, for example 256, is a smaller binary encoded bit weight which is nearest to the binary encoded bit weight from a preceding conversion step, for example 512, and belongs to a group, for example 512, 256, 128, . . . , of binary encoded bit weights. The selected bit weighting value AW is the bit weighting value AW selected by the multiplexer 114 from a preceding conversion step. Following the subtraction, the subtractor 114 therefore supplies, at an output thereof, a new lower bit weighting value UW.

During a conversion step, the adder 126 in each case adds the binary encoded bit weight BG, which is the smaller binary encoded bit weight, for example 256, which is nearest to the binary encoded bit weight, for example 512, from a preceding conversion step, to the new lower bit weighting value UW from the subtractor 124, in order to supply a new upper bit weighting value OW during a conversion step.

In order to read binary encoded bit weights BG, the analog/digital converter 100 preferably also has a device for reading a binary encoded bit weight BG from the memory 102 and for supplying the binary encoded bit weight BG read to the subtractor 124 and to the adder 126.

In order that the conversion speed of the analog/digital converter 100 is not reduced by the calculation of the digital values, the lower bit weighting value UW and the upper bit weighting value OW, with which comparison is to be carried out, are calculated one conversion step before they are needed. Depending on the result of the comparison from the comparator 110, one value from these bit weighting values is selected by the digital multiplexer 114 for the next comparison, and the other is discarded.

The analog/digital converter 100 also has a device 128 for the temporary storage and output of a binary encoded data word DW during the last conversion step of a plurality of conversion steps, the binary encoded data word DW corresponding to the selected bit weighting value AW during the last conversion step. For this purpose, the device 128 preferably has a latch or a buffer memory.

At the beginning of the operation of the analog/digital converter 100, there is a starting value in the first and the second register 104, 106. If, for example, there is a 10-bit converter with ten clock cycles or conversion steps and binary encoded bit weights 512, 256, 128, 64, 32, 16, 8, 4, 2, 1, then for a cold start, in which there is no previous knowledge about the analog value $U_E$ to be converted, a start is made with half the maximum bit weight 256. This value is present in the registers 104 and 106 at the beginning of the A/D conversion, or the registers are initialized to said value. Alternatively, the value from the last analog/digital conversion can be stored in the registers 104 and 106, in order to permit a warm start of the analog/digital converter and therefore a higher conversion speed.

For the purpose of initializing the registers 104, 106, the analog/digital converter 100 preferably has a device for initializing the lower bit weighting value UW in the first register 104 and the upper bit weighting value OW in the second register 106. For a cold start, the initialization device is arranged in such a way that the same initializes the lower bit weighting value UW and the upper bit weighting value OW at the beginning of the first conversion step to the medium binary encoded bit weight of a group of binary encoded bit weights, and the device for reading binary encoded bit weights from the memory 102 is arranged in such a way as to read the maximum binary encoded bit weight during the first conversion step.

For a warm start, the initialization device is arranged in such a way that the same initializes the lower bit weighting value UW and the upper bit weighting value OW at the beginning of the first conversion step to the binary encoded data word DW from a preceding conversion, and the device for reading binary encoded bit weights from the memory 102 is arranged in such a way that, during the first conversion step, said device reads from the memory 102, which is associated with a lower bit weighting value UW and an upper bit weighting value OW, a binary encoded bit weight BG which is located in the vicinity of the binary encoded data word from the preceding conversion.

As a result of the digital construction of the analog/digital converter, it is therefore possible to set the starting value of the conversion to the result from the last conversion. The successive approximation does not then have to be carried out over the entire conversion range. As a result, with fewer conversion steps, the throughput rate can be increased and the power consumption can be reduced.

Since, during the individual conversion steps, it is not just the case, as in a conventional converter with successive approximation (SAR), that a maximum of one reference element, such as a capacitor, has to be connected and one reference element has to be disconnected in order to produce the new comparison value via the digital/analog converter 108, the digital/analog converter 108 is preferably designed in such a way that the binary code is converted into a thermometer code at the input to said converter. Such a digital/analog converter is described in the following text (FIGS. 2 to 4) and in the German Patent Application No. 100 52 944.5 of the Applicant indicated above. As a result, when the binary code becomes greater, only capacitors are connected and no capacitors are disconnected in the digital/analog converter, as a result of which the monotonic character of the digital/analog converter is guaranteed and the loading on the reference voltage becomes a minimum, since the reference voltage source is loaded each time a capacitor is recharged.

Figure 2:
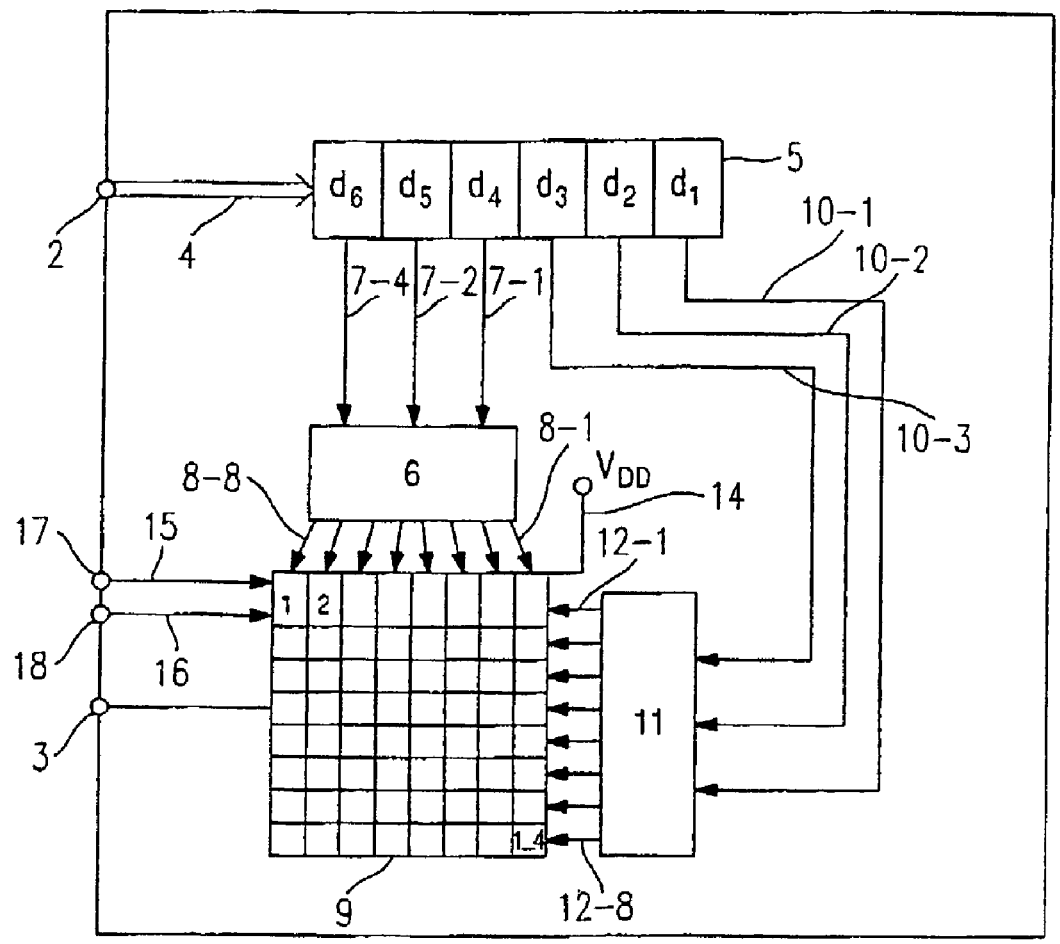
FIG. 2 shows a block circuit diagram of a digital/analog converter with thermometer-encoded control signals for driving the capacitor network.

FIG. 2 shows a digital/analog converter with a capacitor network and thermometer-code drive, which is preferably used in the case of the present invention for the digital/analog converter 108 from FIG. 1.

As can be seen from FIG. 2, the digital/analog converter 1 has a digital signal input 2 and an analog signal output 3. Via the digital signal input 2, an n+m-bit wide data word is written into a temporary store 5 via data lines 4. In the example shown in FIG. 2, the digital data word D to be converted comprises six bits. The digital/analog converter 1 contains a first encoding device 6 which contains the n higher-value data bits of the data word D to be converted and recodes them into a $2^n$-bit wide thermometer-encoded column control signal, which is applied to a capacitor cell matrix 9 via column control lines 8.

The lower-value m data bits d of the digital data word D to be converted are applied via m data lines 10 to a second encoding device 11, which recodes the m lower-value data bits of the data word D to be converted into a $2^m$-bit wide thermometer-encoded row control signal, which is applied to the capacitor cell matrix 9 via $2^m$ row control lines 12.

In the exemplary embodiment illustrated in FIG. 2, the number m of lower-value data bits is three and the number n of higher-value data bits is likewise three, so that the capacitor cell matrix 9 is driven via eight column control lines 8 and via eight row control lines 12. The capacitor cell matrix 9 contains capacitor cells $13_{ij}$ arranged in the form of a matrix in eight columns and eight rows. In the exemplary embodiment illustrated in FIG. 2, the capacitor cell matrix 9 therefore contains 64 capacitor cells 13.

The capacitor cell matrix 9 is supplied with voltage at a supply voltage VDD via a supply voltage line 14. Via lines 15, 16, the capacitor cells 13 contained in the capacitor cell matrix 9 receive reference voltages $V_p$ and $V_n$, which are applied to reference voltage connections 17, 18 of the digital/analog converter 1.

Figure 3:
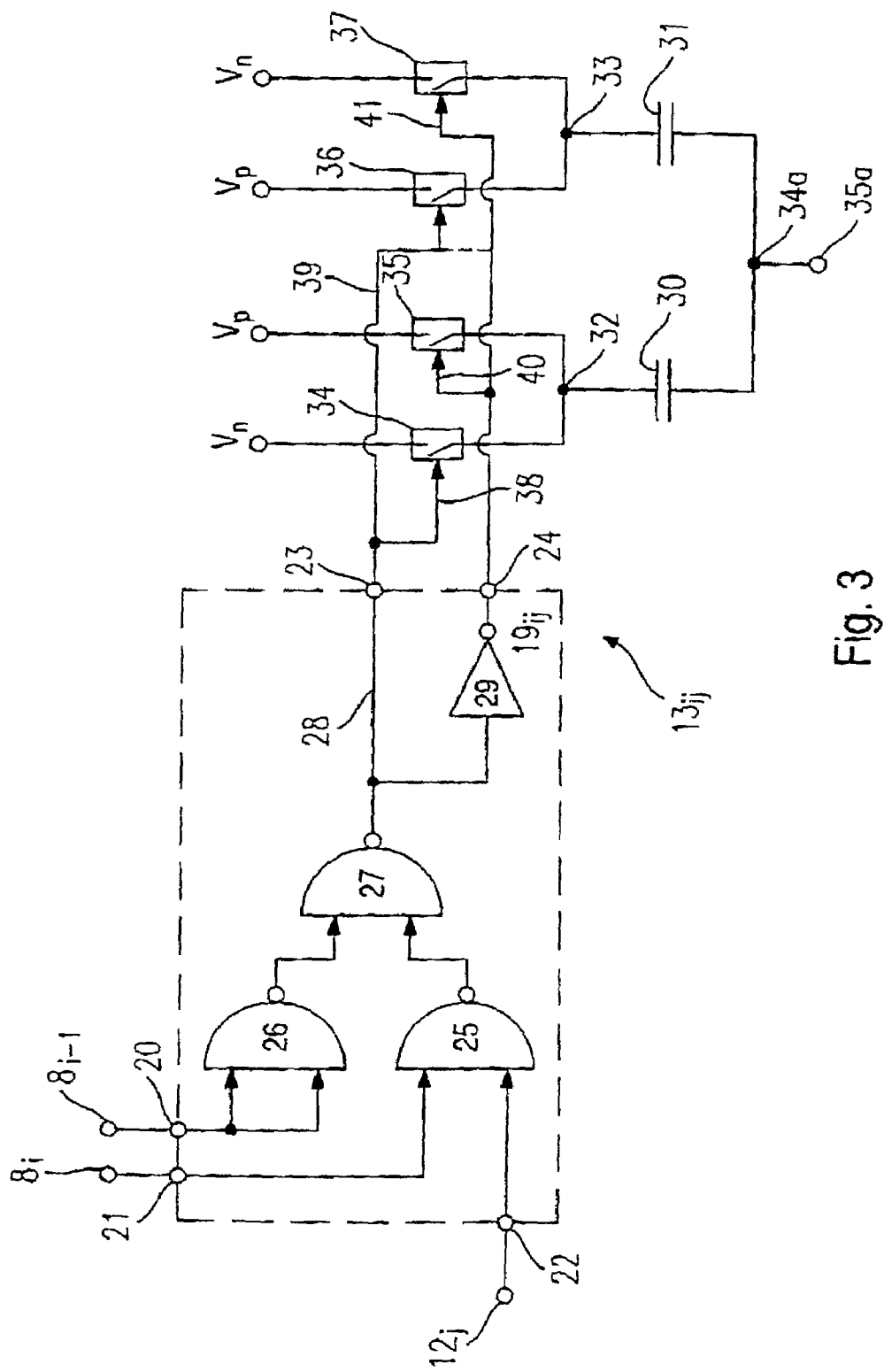
FIG. 3 shows a switching circuit of a capacitor cell of the digital/analog converter of FIG. 2.

FIG. 3 shows the construction of a capacitor cell 13 according to the invention contained in the capacitor cell matrix 9.

The capacitor cell 13 contains a local decoder 19 which, via control connections 20, 21, 22, receives and decodes control signals from the encoding devices 6, 11 via the column control lines 8 and the row control lines 12. The local decoder circuit $19_{ij}$ contained in the capacitor cell $13_{ij}$ also has outputs 23, 24 for driving switches. In the embodiment shown in FIG. 3, the local decoder circuit $19_{ij}$ has a first logic circuit 25 for the logical NAND combination of the signal applied to the ith column control line $8_i$ and the signal applied to the jth row control line $12_j$. The local decoder circuit $19_{ij}$ also contains a second logic circuit 26 for the logical inversion of the control signal applied to the i−1th column control line $8_{i-1}$, the signals output by the first and second logic circuit being logically NAND-combined by a third logic circuit 27. The output signal from the third logic circuit 27 is output via a line 28, directly at the control output 23 belonging to the local decoder circuit 19 or, inverted by an inverter circuit 29, is output at a second control output 24 of the local decoder circuit 19. The three logic circuits 25, 26, 27 of the local decoder circuit 19 are formed by NAND gates in the embodiment shown in FIG. 3.

In addition to the local decoder circuit 19, the capacitor cell 13 has two capacitors 30, 31, which have the same capacitance. The two capacitors 30, 31 each have a first connection 32, 33 and a common, second connection 34a, which is connected to a common potential node 35a of the capacitor cell matrix 9. All capacitors of the capacitor cell matrix 9 are connected to the potential node 35a of the capacitor cell matrix 9.

The first capacitor 30 of the capacitor cell 13 can be connected via a controllable switch 34 to a negative reference voltage $V_n$, and via a controllable switch 35 to a positive reference voltage $V_p$. The second capacitor 31 of the capacitor cell 13 can be connected via a controllable switch 36 to the positive reference voltage $V_p$, and via a controllable switch 37 to the negative reference voltage $V_n$.

The switches 34, 36 are driven via control lines 38, 39 by the control output 23 of the local decoder circuit 19. The switches 35, 37 are driven via control lines 40, 41 by the second control output 24 of the local decoder circuit 19. The two capacitors 30, 31 are connected to opposite reference voltages $V_p$, $V_n$ by the local decoder circuit 19.

Figure 4:
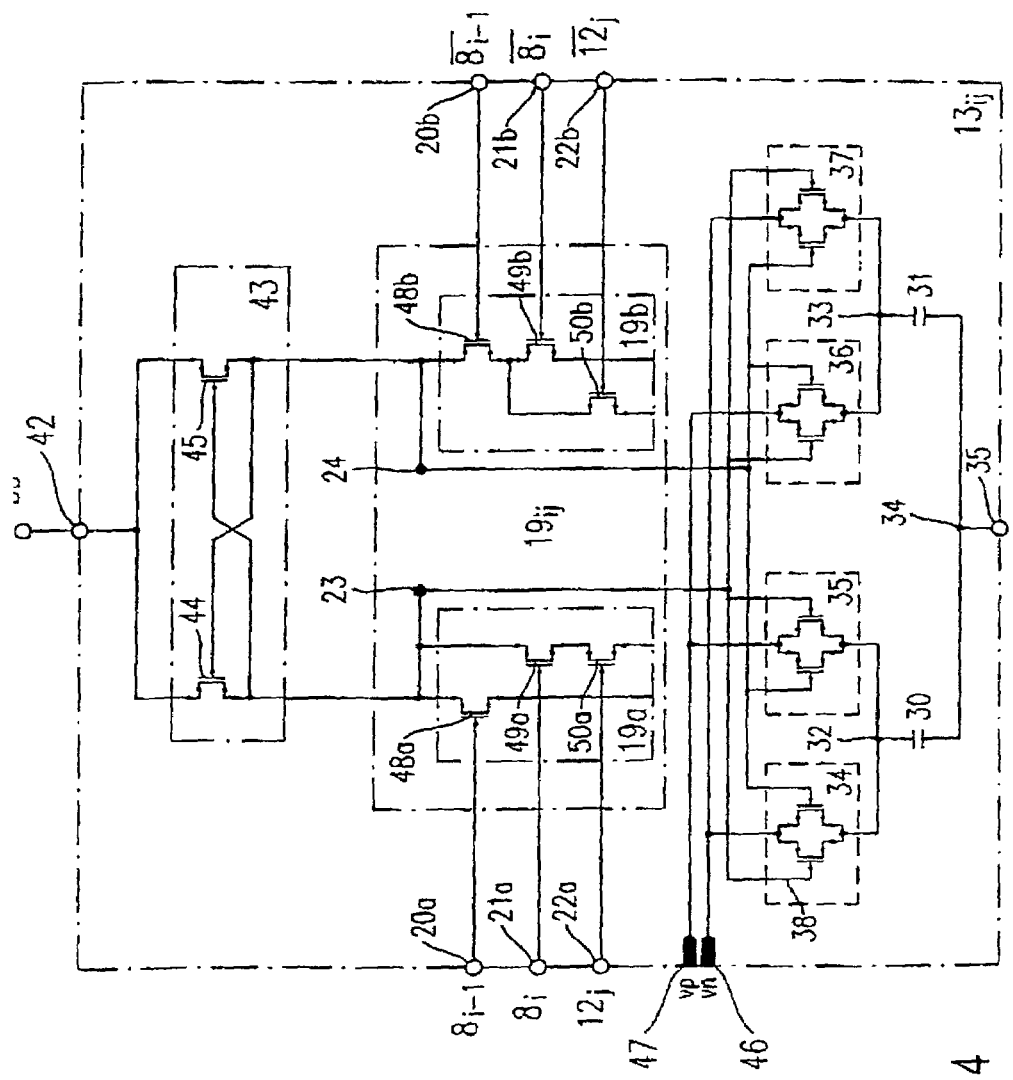
FIG. 4 shows a differentially constructed capacitor cell.

FIG. 4 shows a preferred embodiment of a capacitor cell $13_{ij}$ according to the invention contained in the capacitor cell matrix 9.

The capacitor cell 13ij illustrated in FIG. 4 is constructed completely differentially. Here, the capacitor cell is supplied with a supply voltage $V_{DD}$ via a supply voltage connection 42. The capacitor cell contains a level-changing circuit 43 which, in the embodiment shown in FIG. 4, has two PMOS field effect transistors 44, 45. The local decoder circuit $19_{ij}$ of the capacitor cell $13_{ij}$ is likewise constructed completely differentially and contains a first decoder device 19a and a second decoder device 19b.

The first decoder device 19a controls the switches 34, 35, which are connected to the first capacitor 30 of the differentially constructed capacitor cell 13, on the basis of the thermometer-encoded control signals which are applied to the control signal connections 20a, 21a, 22a and originate from the encoding devices 6, 11.

The second decoder device 19b controls the switches 36, 37, which are connected to the second capacitor 31 of the differentially constructed capacitor cell $13_{ij}$, on the basis of the inverted thermometer-encoded control signals applied to the control connections 20b, 21b, 22b. In the preferred embodiment shown in FIG. 4, the controllable switches 34, 35, 36, 37 are constructed from two complementary MOS-FET transistors. Here, the switch 34 and the switch 37 are connected to a reference voltage connection 46 of the capacitor cell 13 in order to apply a negative reference voltage. The controllable switches 35, 36 are connected to a second reference voltage connection 47 of the capacitor cell 13 in order to apply a positive reference voltage $V_p$.

The decoder devices 19a, 19b of the differentially constructed local decoder circuit 19 each have three MOS field effect transistors 49, 50. The signal present on the control input 20a and belonging to the signal output from the encoding device 6 via the i−1th column control line is inverted by the NMOS field effect transistor 48a. By means of the two field effect transistors 49a, 50a, the control signals applied to the control connections 21, 22 and belonging to the ith column control line and the jth row control line 12 are NAND-combined logically with one another.

The column control lines 8 and the row control lines 12 are likewise constructed differentially, that is to say when the control line 8 changes from a low logic value 0 to a high logic value 1, the complementary line $\overline{8}^1$ changes from the logic value 1 to the logic value 0. In this way, capacitive input coupling is compensated for.

Because of the level-changing circuit 43, the embodiment shown in FIG. 4 has the advantage that the voltage ranges on the control lines 8, 12 can be smaller than the voltage ranges on the capacitors 30, 31 of the capacitor cell 13. The encoding circuit 19 is controlled, for example, by control signals which have a voltage range of 1.8 volts, while the capacitors 30, 31 can be charged up with a voltage range of, for example, 3.3 volts, corresponding to a supply voltage $V_{DD}$.

The capacitor cells 13 of the capacitor cell matrix 9 within the digital/analog converter according to the invention are preferably produced using CMOS technology.

In the digital/analog converter 1, the capacitor cell matrix 9 is driven with two thermometer-encoded control signals, which are produced by the two encoding devices 6, 11. The two encoding devices 6, 11 carry out recoding of binary encoded data bits belonging to the data word to be converted into a thermometer code, each encoding device 6, 11 preferably recoding half of the data bits to be converted. The ultimate encoding is carried out in the capacitor network 9 by the local decoder circuits 19 contained in the capacitor cells 13. In order to compensate for capacitive input coupling, the control lines 8, 12 are constructed differentially.

Because of the use of thermometer-encoded control signals, the differential nonlinearity DNL of the digital/analog converter 1 according to the invention is reduced considerably since, during the change from one digital value to the next digital value, only one capacitor cell 13 of the capacitor network 9 has to be connected or disconnected, and therefore the effects of matching errors are considerably lower.

The advantage of the very low power consumption of the analog/digital converter according to the invention can be increased still further if a restriction to the slew rate or to the rise rate of the input values to be converted is tolerated. In the case of a Nyquist converter, it is assumed that the signal to be converted can change in an arbitrary manner from one sample to the next sample. In the case of oversampling, however, the accuracy can be increased and the restriction can be applied such that the analog input signal $U_E$ changes only by a specific number of LSB from one sample to the next sample. If the registers 104, 106 of the analog/digital converter 102 of FIG. 1 are not reset during a new conversion, the new value to be converted can first be compared with the last converted value. If, for example, the first four conversion steps are allowed to be omitted and if, during the next step, a comparison is made with a value which is 38 LSB greater or smaller, depending on the result of the first step, although the possible slew rate is restricted to these 38 LSB, the conversion is faster because of the four steps that have been left out and, primarily, during each conversion both the driver for the analog input voltage and the driver for the reference voltage merely have to recharge this 38-LSB proportion of the total range, as a result of which a great deal of lost power can be saved.

It should be noted further that the capacitors of the digital/analog converter of FIGS. 2 to 4 can also be used as sample & hold capacitors, the charge needed by the thermometer-encoding drive during the conversion being the maximum needed to recharge the capacitor network once.

Although the present invention has been described above using a preferred exemplary embodiment, said invention is not restricted thereto, but can be modified in many ways.

The invention claimed is:

1. An A/D converter for converting an analog input signal into a binary-encoded word during a series of conversion steps, the A/D converter comprising:

a bit-weight memory for storing a group of binary-encoded bit weights for encoding an analog input signal into a binary-encoded data word, the group including at least a maximum binary-encoded bit weight, a minimum binary-encoded bit weight, and a medium binary-encoded bit weight;

a first register in communication with the bit-weight memory for storage of a lower bit weight during a conversion step;

a second register in communication with the bit-weight memory for storage of an upper bit weight during the conversion step;

a D/A converter for converting one of the upper and lower bit weights into an analog bit-weighting signal during the conversion step;

a comparison device in communication with the D/A converter for providing a comparison result indicative of a comparison between the analog input signal and the analog bit-weighting signal during the conversion step;

a third register in communication with the comparison device for storage of the comparison result during the conversion step;

a multiplexer in communication with the first and second registers for selecting, during the conversion step, a bit weight from one of the upper and lower bit weights, the multiplexer being configured
- to select the upper bit weight when the comparison result indicates that the analog input signal is greater than the analog bit-weighting signal; and
- to select the lower bit weight when the comparison result indicates that the analog input signal is less than the analog bit-weighting signal;

a subtractor in communication with the multiplexer and with the bit-weight memory for providing a new lower bit weight for the conversion step, the subtractor being configured to subtract, from the bit weight of a preceding conversion step, a smaller binary-encoded bit weight selected from the group of binary-encoded bit weights, the smaller binary-encoded bit weight being
- smaller than the binary-encoded bit weight selected in the preceding conversion step; and
- closest to the binary-encoded bit weight selected in the preceding conversion step; and an adder in communication with the bit-weight memory and the subtractor for providing a new upper bit weight for the conversion step, the adder being configured to add the new lower bit weight provided by the subtractor to the smaller binary-encoded bit weight.

2. The A/D converter of claim 1, further comprising an initialization device for storing an initial lower bit weight in the first register and an initial upper bit weight in the second register.

3. The A/D converter of claim 2, further comprising a reader in communication with the bit-weight memory and the subtractor for reading a selected binary-encoded bit weight from the bit-weight memory and providing the selected binary-encoded bit weight to the subtractor.

4. The A/D converter of claim 3, wherein the initialization device is configured to initialize the first and second registers at the first conversion step by storing therein a central binary-encoded bit weight selected from the group of binary-encoded bit weights, and the reader is configured to provide the subtractor with the largest binary-encoded bit weight at the first conversion step.

5. The A/D converter of claim 3, wherein the initialization device is configured to initialize the first and second registers at the first conversion step by storing therein a binary-encoded data word resulting from a preceding sequence of conversion steps, and the reader is configured to provide, during the first conversion step, the subtractor with a binary-encoded bit weight associated with an upper and lower bit weighting value data word and with a location with which the binary encoded data word is associated.

6. The A/D converter of claim 1, wherein the D/A converter comprises:

a capacitor cell matrix having capacitors arranged in rows and columns, a plurality of column control lines, each of which is in communication with all capacitors on a particular column a plurality of row control lines, each of which is in communication with all capacitors in a particular row;

a first encoder for recoding n most significant data bits of a bit weight into a $2^n$-bit wide thermometer-encoded column control signal to be applied to a selected column control line; and a second encoded for recoding n most significant data bits of a bit weight into a $2^n$-bit wide thermometer-encoded row control signal to be applied to a selected row control line.

7. The A/D converter of claim 6, wherein the capacitor cell matrix comprises a local decoder circuit associated with each capacitor therein, the local decoder circuit including:

a first logic circuit in communication with the column control line and the row control line connected to an associated capacitor, the first logic circuit being configured to provide, at an output thereof, the logical NAND of the column control signal and the row control signal applied to the associated capacitor;

a second logic circuit in communication with the column control line connected to the associated capacitor, the second logic circuit being configured to provide, at an output thereof, a logical inverse of the column control signal applied to the associated capacitor;

a third logic circuit in communication with the outputs of the first and second logic circuits for controlling the associated capacitor, the third logic circuit being configured to generate the logical NAND of the output signals of the first logic circuit and the second logic circuit and to provide therefrom a local control signal for controlling the associated capacitor.

8. The A/D converter of claim 6, wherein the capacitor cells comprise differential circuits.

9. The A/D converter of claim 6, wherein each capacitor cell comprises first and second capacitors having the same capacitances, each capacitor being connected to
- a first switch connected to a source of positive reference voltage, and with
- a second switch connected to a source of negative reference voltage.

10. The A/D converter of claim 7, wherein the local decoder circuit comprises a differential circuit.

11. The A/D converter of claim 8, wherein the local decoder circuit comprises a first decoder configured to respond to thermometer-encoded control signals by driving the first and second switches connected to the first capacitor; and a second decoder configured to respond to inverted thermometer-encoded control signals by driving the first and second switches connected to the second capacitor.

12. The A/D converter of claim 9, wherein the first and second capacitors each comprise a connection to a common potential node of the capacitor cell matrix.

13. The A/D converter of claim 12, wherein the common potential node is connected to a signal output of the D/A converter.

14. The A/D converter of claim 7, further comprising a level changing circuit configured to provide a supply voltage to the local decoder circuit for increasing a voltage range on the capacitors.

15. The A/D converter of claim 6, wherein the control lines are differential control lines.

16. The A/D converter of claim 9, wherein the D/A converter comprises a buffer in communication with the first and second encoding devices for temporary storage of a bit weight.

17. The A/D converter of claim 1, further comprising a clock signal generator in communication with the first, second, and third registers for providing a clock signal thereto, the clock signal temporally controlling the occurrence of the conversion steps.

18. The A/D converter of claim 1, wherein the first and second registers are configured to provide the multiplexer with upper and lower bit weights in a particular conversion step, the upper and lower bit weights having been obtained during a previous conversion step.

19. The A/D converter of claim 1, wherein the group of binary-encoded bit weights comprises:

the binary-encoded bit weights 512, 256, 128, 64, 32, 16, 8, 4, 2, and 1, when there are to be ten conversion steps;

the binary-encoded bit weights 478, 255, 136, 72, 38, 20, 11, 6, 4, 2, 1 when there are to be eleven conversion steps; and the binary-encoded bit weights 447, 251, 142, 80, 45, 25, 14, 8, 5, 3, 2, 1, when there are to be twelve conversion steps.

20. The A/D converter of claim 1, wherein the bit weight memory comprises a memory element selected from the group consisting of: a read-only memory, a random-access memory, and an erasable programmable read-only memory.

21. The A/D converter of claim 17, wherein the first, second, and third registers are configured to be controlled by the clock signal.

22. The A/D converter of claim 1, wherein the comparison element comprises a comparator.

23. The A/D converter of claim 1, wherein the multiplexer comprises a digital multiplexer.

24. The A/D converter of claim 1, further comprising an output memory in communication with the multiplexer for outputting the bit weight selected by the multiplexer.

* * * * *